United States Patent
Ling et al.

(10) Patent No.: US 7,029,307 B1
(45) Date of Patent: Apr. 18, 2006

(54) SYSTEMS AND METHODS FOR AN IMPROVED CARD-EDGE CONNECTOR

(75) Inventors: Yun Ling, Portland, OR (US); Daniel (Thai) Tong, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/011,563

(22) Filed: Dec. 14, 2004

(51) Int. Cl.
*H01R 13/62* (2006.01)
(52) U.S. Cl. .................................................... 439/327
(58) Field of Classification Search ................ 439/327, 439/328, 157, 159, 325, 326
See application file for complete search history.

(56) References Cited

U.S. PATENT DOCUMENTS

| | | | | |
|---|---|---|---|---|
| 4,898,540 A | * | 2/1990 | Saito | .......................... 439/153 |
| 5,413,497 A | * | 5/1995 | Lwee | .......................... 439/328 |
| 5,470,240 A | | 11/1995 | Suzuki | |
| 5,660,552 A | * | 8/1997 | Suzuki et al. | ................ 439/159 |
| 5,944,549 A | * | 8/1999 | Po et al. | ...................... 439/326 |
| 6,431,889 B1 | | 8/2002 | Olson | |
| 2002/0141170 A1 | * | 10/2002 | Rhoads | ........................ 361/796 |
| 2002/0196650 A1 | * | 12/2002 | Chang | .......................... 365/63 |

* cited by examiner

*Primary Examiner*—Ross Gushi
(74) *Attorney, Agent, or Firm*—Buckley, Maschoff & Talwalkar LLC (57) ABSTRACT

According to some embodiments, an electrical connector may comprise a first end and a second end, wherein the electrical connector defines a channel. In some embodiments, one or more electrical contacts may be disposed within the channel. Further, a fixed retention mechanism may be coupled to the first end of the electrical connector, wherein the fixed retention mechanism is to couple to a detent portion of an electrical component.

14 Claims, 7 Drawing Sheets

COUPLING A FIRST PORTION OF AN ELECTRICAL COMPONENT TO A FIXED-POSITION RETENTION MECHANISM COUPLED TO A FIRST END OF AN ELECTRICAL CONNECTOR 302

ROTATING THE ELECTRICAL COMPONENT TO COUPLE A PLURALITY OF ELECTRICAL CONTACTS OF THE ELECTRICAL COMPONENT TO A PLURALITY OF ELECTRICAL CONTACTS DISPOSED WITHIN A CHANNEL DEFINED BY THE ELECTRICAL CONNECTOR 304

SYSTEMS AND METHODS FOR AN IMPROVED CARD-EDGE CONNECTOR

BACKGROUND

Electrical components such as circuit boards (e.g., a Single In-line Memory Module (SIMM) and/or a Dual In-line Memory Module (DIMM)), expansion cards (e.g., video cards, sounds cards, and/or other interface cards), and/or other components are often required to be removably connected to other devices. One method of removably connecting such components involves the use of card-edge connectors. Card-edge connectors may be utilized to electrically couple an edge of an electrical component to another device and/or component.

Figure 1:
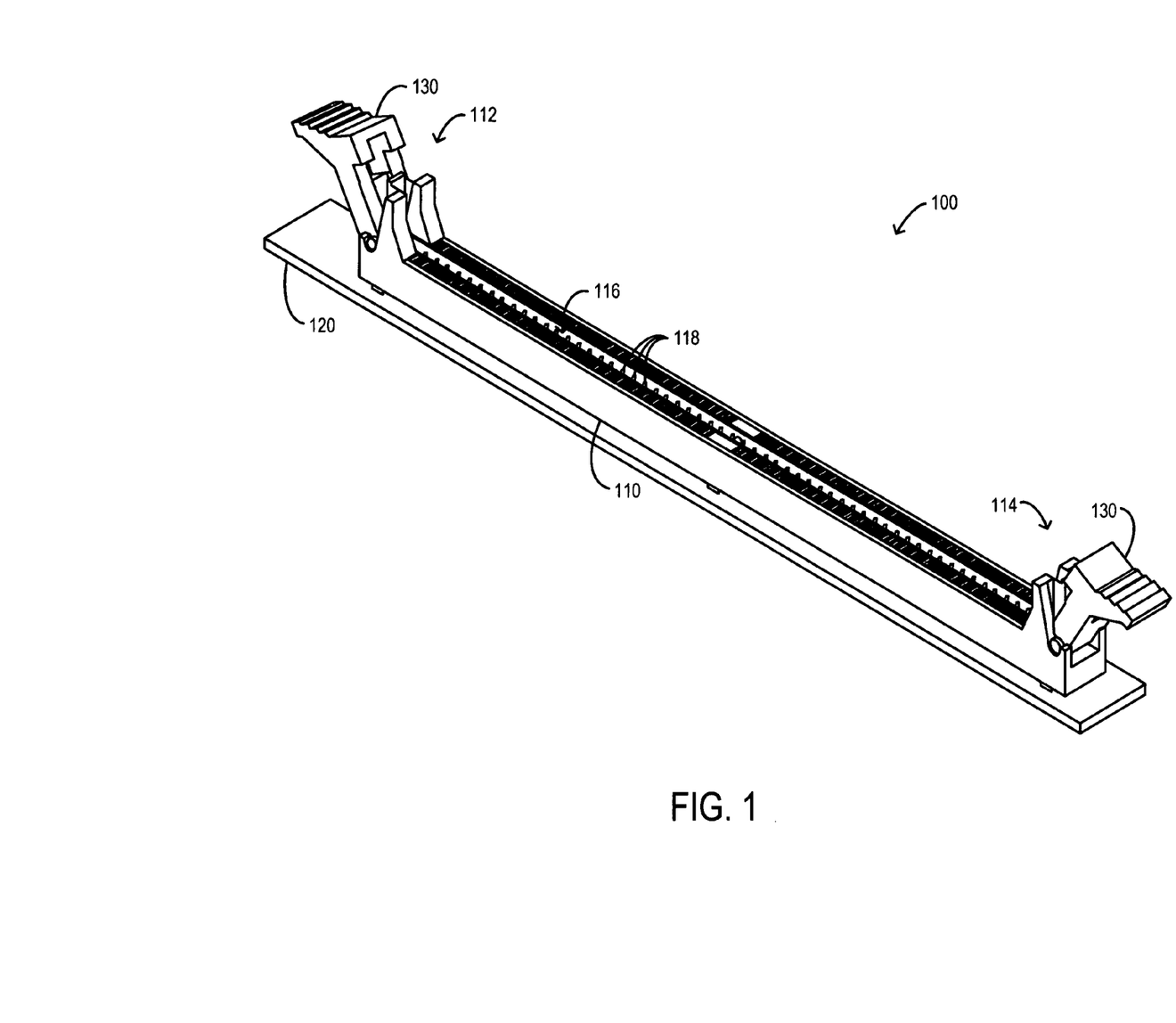
FIG. 1 is a perspective diagram of a system.

Referring to FIG. 1, for example, a system 100 is shown. The system 100 may comprise a card-edge electrical connector 110 having a first end 112 and a second end 114. The card-edge electrical connector 110 may, in some configurations, define a channel 116 and/or may include electrical contacts 118 within the channel 116. An edge of a circuit board and/or other electrical component (not shown in FIG. 1) may, for example, be inserted into the channel 116 to couple to and/or otherwise engage the electrical contacts 118. The card-edge electrical connector 110 may be attached and/or mounted to a substrate such as a circuit board 120. The card-edge electrical connector 110 may, for example, electrically and/or physically couple the electrical component to the circuit board 120.

In some configurations, the card-edge electrical connector 110 may also include two moveable retention mechanisms 130. Once an electrical component is inserted into the channel 116, for example, the moveable retention mechanisms 130 (e.g., located on both the first and second ends 112, 114 of the card-edge electrical connector 110) may be pivoted toward the electrical component to couple to the electrical component. The moveable retention mechanisms 130 may, when engaged with the electrical component, substantially prevent the electrical component from being dislodged and/or otherwise removed from the card-edge electrical connector 110. The two moveable retention mechanisms 130 may, however, not be suitable for use in some systems.

DETAILED DESCRIPTION

Figure 2:
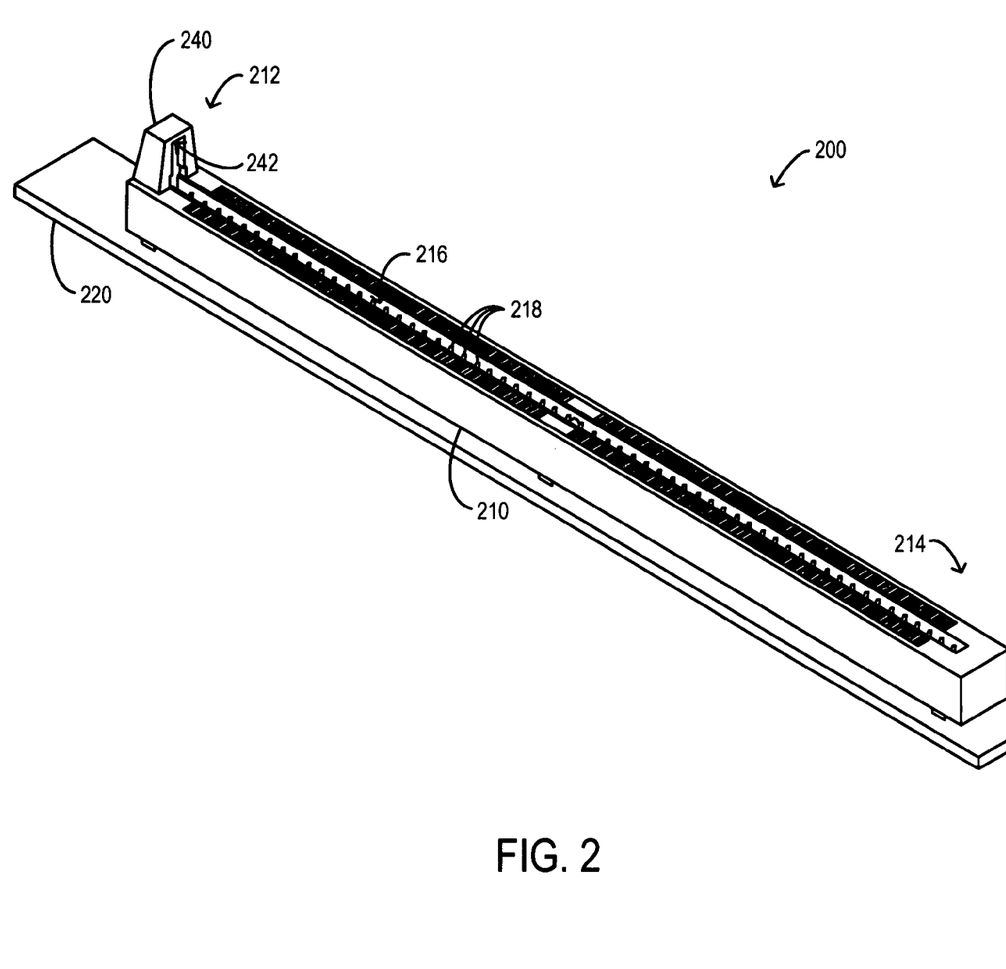
FIG. 2 is a perspective diagram of a system according to some embodiments.

Referring to FIG. 2, a perspective diagram of a system 200 according to some embodiments is shown. In some embodiments, the system 200 may comprise an electrical connector 210. The electrical connector 210 may, according to some embodiments, comprise a first end 212 and a second end 214. The electrical connector 210 may also or alternatively define a channel 216 (e.g., extending substantially from the first end 212 to the second end 214). In some embodiments, one or more electrical contacts 218 may be disposed within the channel 216.

The electrical connector 210 may, according to some embodiments, be coupled to a substrate 220. The substrate 220 may, for example, be or include a Printed Circuit Board (PCB) such as a motherboard. According to some embodiments, the electrical connector 210 may comprise a fixed retention mechanism 240. The fixed retention mechanism 240 may, as shown in FIG. 2 for example, be disposed on and/or coupled to the first end 212 of the electrical connector 210. In some embodiments, the fixed retention mechanism 240 may comprise a lip 242 to engage an electrical component (not shown in FIG. 2).

According to some embodiments, the components 210, 212, 214, 216, 218, 220 of the system 200 may be similar in configuration and/or functionality to the similarly-named components described in conjunction with FIG. 1. In some embodiments, the system 200 may include fewer or more components than are shown in FIG. 2. The various systems described herein are depicted for use in explanation, but not limitation, of described embodiments. Different types, layouts, quantities, and configurations of any of the systems described herein may be used without deviating from the scope of some embodiments.

In some embodiments, the system 200 may be or include a system or device in which space constraints are a concern. The electrical connector 210, for example, may be a memory module connector in a Personal Computer (PC), laptop computer, blade server, and/or other Small Form Factor (SFF) electrical device. According to some embodiments, the fixed retention mechanism 240 may permit space to be saved in the system 200. The electrical component may be inserted and/or locked into the channel 216, for example, without requiring any space (e.g., free-space and/or a "keep-out" zone) to the left of the first end 212 of the electrical connector 210. In other words, while a typical moveable retention mechanism (such as the moveable retention mechanism 130 shown in FIG. 1) may need to be rotated into the space to the left of the first end 212 (e.g., to allow the electrical component to be inserted into the channel 216), the fixed retention mechanism 240 may be capable of accepting the electrical component without requiring the space to the left of the first end 212 to be kept clear (e.g., of other electrical components that may be included in the system 200).

In some embodiments, the fixed retention mechanism 240 may also or alternatively reduce manufacturing costs associated with the system 200. Typical moveable retention mechanisms, for example, are molded separately from the electrical connector 210 and are attached to the electrical connector 210 via a pin that facilitates rotation of the moveable retention mechanism. The pin may, in some configurations, be a weak structural component of the electrical connector 210 and/or may be otherwise prone to structural failure.

According to some embodiments, the fixed retention mechanism 240 may be integrated with the electrical connector 210. The fixed retention mechanism 240 may, for example, be separately molded and then attached (e.g., in a substantially non-moveable and/or fixed manner) to the electrical connector 210. In such a manner, for example, a pin may not be required, reducing manufacturing and/or assembly costs, and/or eliminating a potential point of structural failure.

According to some embodiments, the fixed retention mechanism 240 may be otherwise integrated with the electrical connector 210. In some embodiments, the fixed retention mechanism 240 may be a piece, portion, and/or component of the electrical connector 210. For example, the fixed retention mechanism 240 may be molded and/or milled from the same piece of material as the electrical connector 210. In such a manner, for example, assembly costs may be reduced by eliminating the need to assemble a retention mechanism onto the first end 212 of the electrical connector 210.

Figure 3:
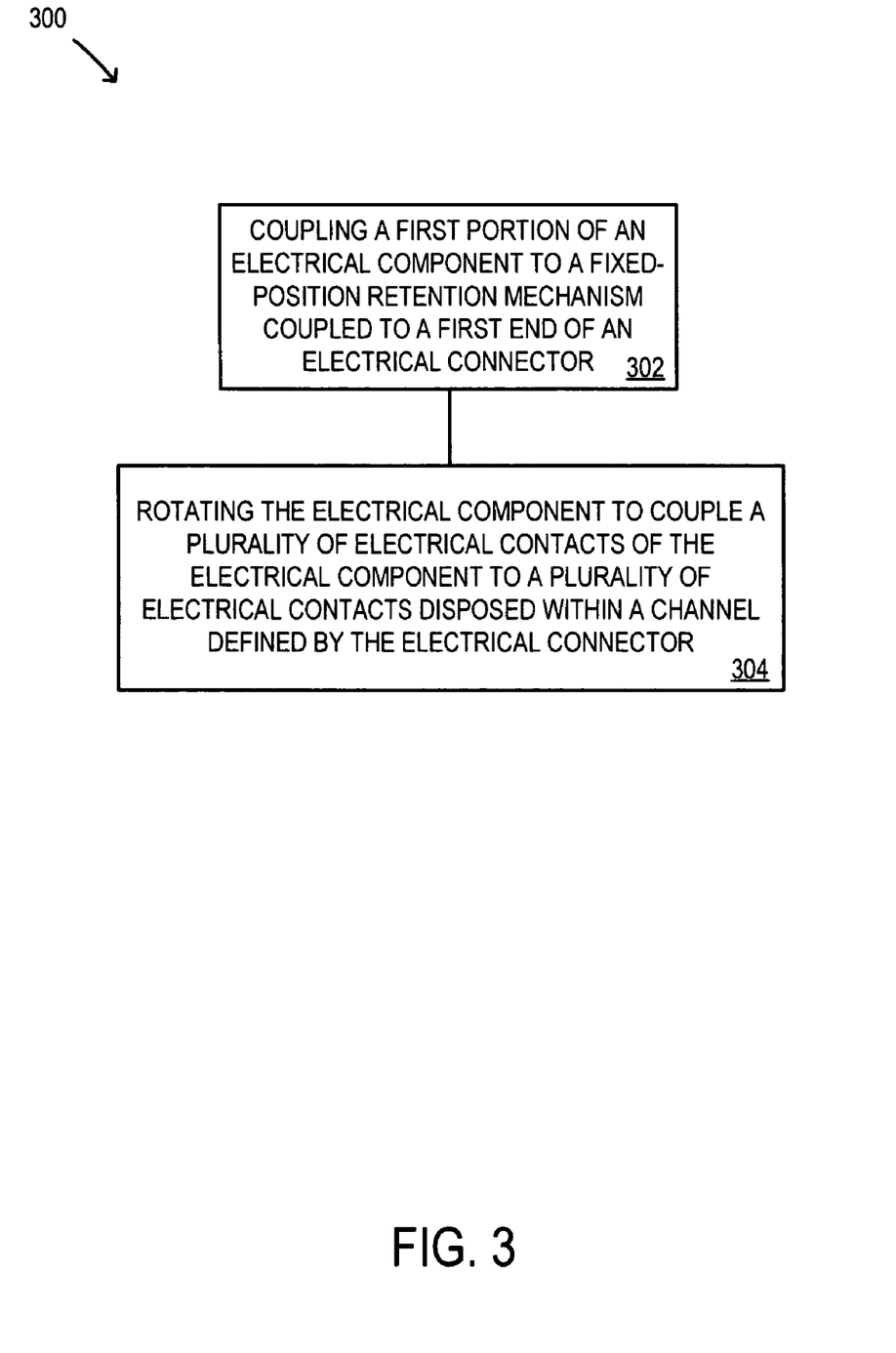
FIG. 3 is a flow diagram of a method according to some embodiments.

Referring now to FIG. 3, a method 300 according to some embodiments is shown. In some embodiments, the method 300 may be conducted by and/or by utilizing the system 200 and/or may be otherwise associated with the system 200 and/or any of the system components described in conjunction with FIG. 2. The flow diagrams described herein do not necessarily imply a fixed order to the actions, and embodiments may be performed in any order that is practicable. Note that any of the methods described herein may be performed by hardware, software (including microcode), firmware, manual means, or any combination thereof. For example, a storage medium may store thereon instructions that when executed by a machine result in performance according to any of the embodiments described herein.

In embodiments, the method 300 may begin at 302 by coupling a first portion of an electrical component to a fixed retention mechanism coupled to a first end of an electrical connector. The first portion of the electrical component may, for example, be coupled to the fixed retention mechanism 240 shown in FIG. 2. In some embodiments, the first portion of the electrical connector may be coupled to the lip 242 of the fixed retention mechanism 240. According to some embodiments, the first portion of the electrical component may also or alternatively be inserted into a channel defined by the electrical connector (such as channel 216). The first portion of the electrical component may be or include, for example, a first end of the electrical component, a detent, a cutout, a protrusion, and/or any other type or configuration of feature and/or features that is or becomes known or practicable.

The method 300 may continue, according to some embodiments, by rotating the electrical component to couple a plurality of electrical contacts of the electrical component to a plurality of electrical contacts disposed within a channel defined by the electrical connector, at 304. In the case that the electrical component is a memory module, for example, the electrical contacts of the memory module may be mated with electrical contacts of the electrical connector. In some embodiments, such as in FIG. 2 where the electrical connector defines the channel 216 that contains the electrical contacts 218, the memory module may be inserted into the channel to mate the electrical contacts. According to some embodiments, the fixed retention mechanism may facilitate the rotational coupling of the electrical component to the electrical connector. According to some embodiments, one or more electrical contacts may be mated and/or coupled substantially simultaneously with the coupling of the first portion of the electrical component to the fixed retention mechanism, at 302.

According to some embodiments, the electrical component may be removed from the electrical connector utilizing a reverse procedure. For example, the electrical component may be rotated (e.g., in the opposite direction utilized to couple the electrical component) to uncouple the electrical contacts and/or to uncouple the first portion from the fixed retention mechanism. In some embodiments, the electrical component may be otherwise uncoupled from the fixed retention mechanism (e.g., after reverse rotation). In such a manner, for example, the electrical component may be inserted into and/or removed from the electrical connector without requiring free-space adjacent to at least one end of the electrical connector (e.g., saving space in any system that the electrical connector with the fixed retention mechanism is utilized in).

Figure 4:
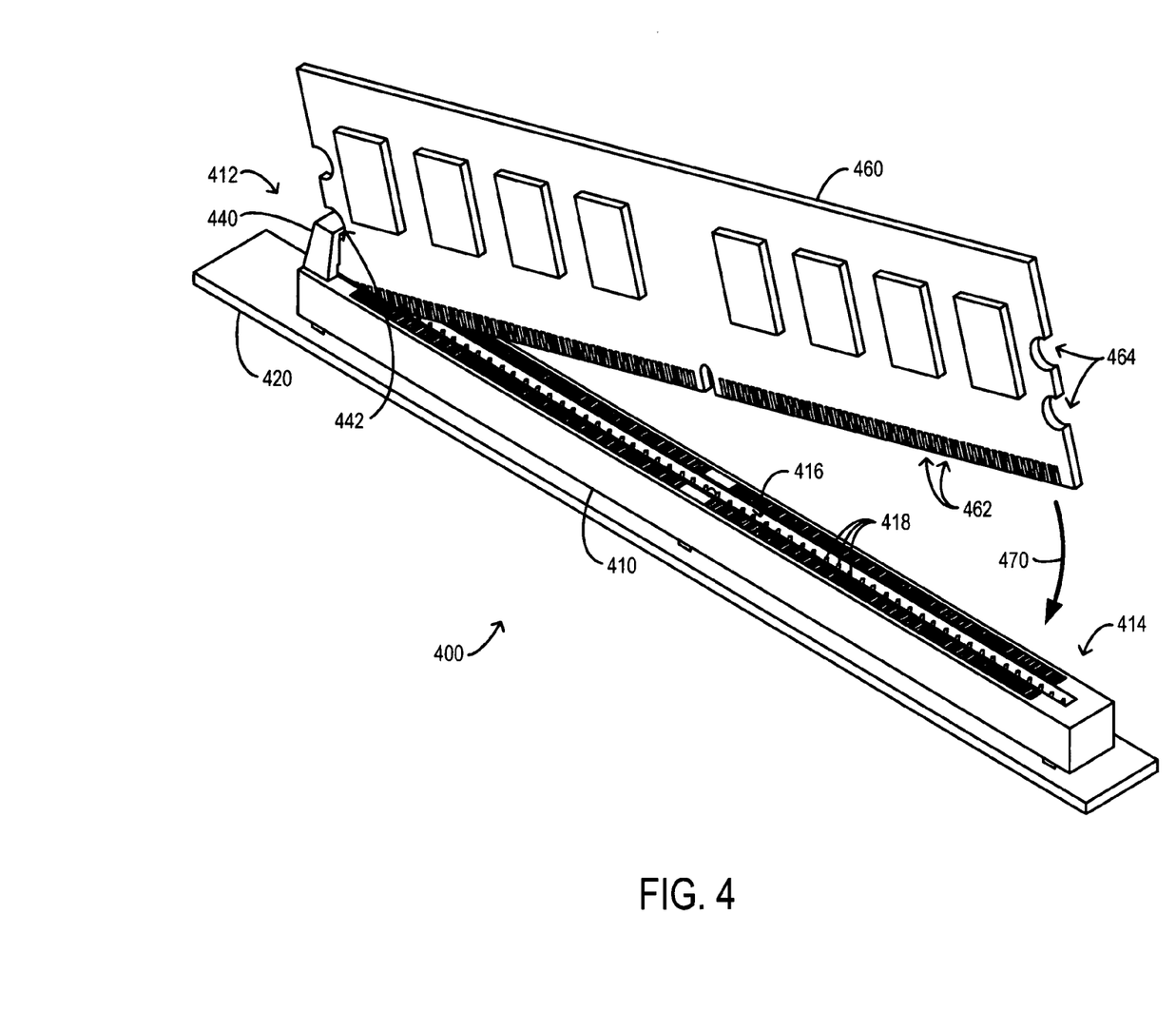
FIG. 4 is a perspective diagram of a system according to some embodiments.

Turning to FIG. 4, a perspective diagram of a system 400 according to some embodiments is shown. In some embodiments, the system 400 may be similar to the system 200 as described in conjunction with FIG. 2. According to some embodiments, the system 400 may be utilized to perform and/or may be otherwise associated with the method 300 described herein. The system 400 may, for example, comprise an electrical connector 410. The electrical connector 410 may, according to some embodiments, comprise a first end 412 and a second end 414. The electrical connector 410 may also or alternatively define a channel 416. In some embodiments, one or more electrical contacts 418 may be disposed within the channel 416.

The electrical connector 410 may, according to some embodiments, be coupled to a substrate 420. According to some embodiments, the electrical connector 410 may also or alternatively comprise a fixed retention mechanism 440 disposed on and/or coupled to the first end 412 of the electrical connector 410. In some embodiments, the fixed retention mechanism 440 may comprise a lip 442 to engage an electrical component 460. The electrical component 460 may, for example, comprise a plurality of electrical contacts 462 and/or one or more detents 464.

According to some embodiments, the components 410, 412, 414, 416, 418, 420, 440, 442 of the system 400 may be similar in configuration and/or functionality to the similarly-named components described in conjunction with FIG. 2. In some embodiments, the system 400 may include fewer or more components than are shown in FIG. 4.

In some embodiments, the electrical component 460 may be coupled to the fixed retention mechanism 440 (e.g., at 302). For example, one of the detents 464 of the electrical component 460 may be engaged with the lip 442 of the fixed retention mechanism 440. As shown in FIG. 4, the first end of the electrical component 460 may be partially inserted into the channel 416 to engage the lower detent 464 of the first end of the electrical component 460 with the lip 442. According to some embodiments, the detent 464 may be or include a semi-circular cutout such as shown in FIG. 4. Other types, quantities and/or configurations of detents 464 and/or other coupling mechanisms may also or alternatively be used.

The lip 442 may, according to some embodiments, function as a fulcrum and/or pivot point that facilitates the rotation of the electrical component 460 (e.g., at 304). The edge of the detent 464 may, for example, be rotated against the lip 442 to facilitate and/or permit the electrical component to be rotated toward the channel 416 (e.g., in accordance with the directional arrow 470). The lip 442 may be or include any structure, object, and/or device that permits and/or facilitates the coupling of the electrical component 460 to the electrical connector 410. The lip 442 may, for example, be an upper surface within the fixed retention mechanism 440 and/or may be or include a detent, protrusion, edge, and/or other surface associated with the fixed retention mechanism 440.

In some embodiments, as the electrical component 460 is rotated into the channel 416 in accordance with the directional arrow 470, the electrical contacts 462 of the electrical component 460 may engage the respective electrical contacts 418 of the electrical connector 410. According to some embodiments, the electrical contacts 418, 462 may be mated and/or coupled one at a time and/or a small number at a time, from left to right (e.g., as the electrical component 460 is rotated and inserted into the channel 416 from left to right).

In some embodiments, the rotation of the electrical component 460 may facilitate and/or allow easier insertion of the electrical component 460 into the channel 416. In the typical case that the electrical component 460 is inserted directly into the channel 416 (e.g., all electrical contacts 418, 462 are substantially simultaneously coupled), for example, a first (and usually large) amount of force may be required to couple the electrical component 460 to the electrical connector 410. In other words, the coupling of each respective pair of electrical contacts 418, 462 may require a force. In the case that all electrical contacts 418, 460 are coupled (e.g., via direct insertion), the total instantaneous force (i.e., the first force) required may be the sum of each of the individual coupling forces (e.g., since all couplings take place substantially simultaneously).

In the case that the fixed retention mechanism 440 is utilized to operate as a fulcrum and/or pivot point, however, the electrical component 460 may be inserted into the channel 416 via rotation. The rotational insertion may, according to some embodiments, cause only a single and/or a small number of electrical contacts 418, 462 to be substantially simultaneously coupled. The instantaneous force (i.e., a second force) required for electrical component 460 insertion may, therefore, be substantially less than is required for typical direct insertion. Further, torque and/or leverage effects may increase the ease of insertion (e.g., decrease required insertion forces) for each unit length of the electrical component 460.

Figure 5:
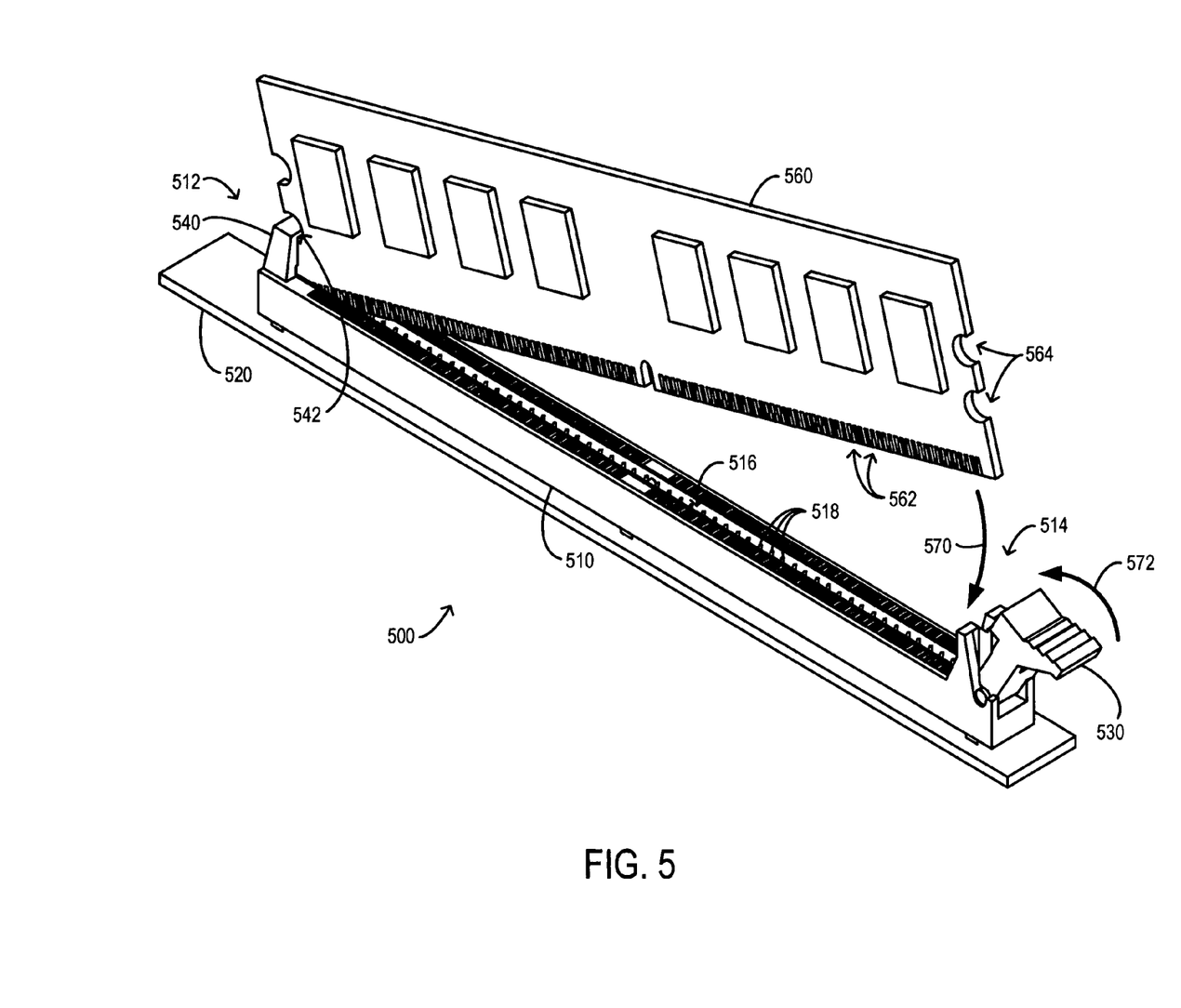
FIG. 5 is a perspective diagram of a system according to some embodiments.

Referring now to FIG. 5, a perspective diagram of a system 500 according to some embodiments is shown. In some embodiments, the system 500 may be similar to the systems 200, 400 as described in conjunction with any of FIG. 2 and/or FIG. 4. According to some embodiments, the system 500 may be utilized to perform and/or may be otherwise associated with the method 300 described herein. The system 500 may, for example, comprise an electrical connector 510. The electrical connector 510 may, according to some embodiments, comprise a first end 512 and a second end 514. The electrical connector 510 may also or alternatively define a channel 516. In some embodiments, one or more electrical contacts 518 may be disposed within the channel 516.

The electrical connector 510 may, according to some embodiments, be coupled to a substrate 520. According to some embodiments, the electrical connector 510 may also or alternatively comprise a moveable retention mechanism 530 disposed on and/or coupled to the second end 514 of the electrical connector 510, and/or a fixed retention mechanism 540 disposed on and/or coupled to the first end 512 of the electrical connector 510. In some embodiments, the fixed retention mechanism 540 may comprise a lip 542 to engage an electrical component 560. The electrical component 560 may, for example, comprise a plurality of electrical contacts 562 and/or one or more detents 564.

According to some embodiments, the components 510, 512, 514, 516, 518, 520, 530, 540, 542, 560, 562, 564 of the system 500 may be similar in configuration and/or functionality to the similarly-named components described in conjunction with any of FIG. 2 and/or FIG. 4. In some embodiments, the system 500 may include fewer or more components than are shown in FIG. 5.

In some embodiments, the fixed retention mechanism 540 may be utilized to couple the electrical component 560 to the electrical connector 510 (e.g., at 302). One of the detents 564 of the electrical component 560, such as the semi-circular cutouts shown in FIG. 5 for example, may be inserted into the fixed retention mechanism 540. According to some embodiments, the detent 564 may pivot within the fixed retention mechanism 540 as the electrical component 560 is rotated toward the channel 516 (e.g., in accordance with the directional arrow 570). The detent 564 may, for example, pivot about and/or on the lip 542 of the fixed retention mechanism 540.

As the electrical component 560 is inserted in a rotational manner into the channel 516, the electrical contacts 562 of the electrical component 560 may couple (e.g., electrically and/or physically) to corresponding electrical contacts 518 within the channel 516 (e.g., at 304). Once the right side of the electrical component 560 is inserted into the channel and/or coupled to the electrical connector 510, the electrical component 560 may be secured. To substantially prevent uncoupling of the electrical component 560 from the electrical connector 510 (and/or the channel 516 thereof), for example, the movable retention mechanism 530 on the second end 514 of the electrical connector 510 may be rotated (e.g., in accordance with the directional arrow 572) to engage the electrical component 560.

According to some embodiments, the moveable retention mechanism 530 may couple to a detent 564 of the electrical component 560. A portion of the moveable retention mechanism 530 may, for example, latch onto a detent 564 such as the semi-circular cutouts shown in FIG. 5. In some embodiments, the moveable retention mechanism 530 may substantially prevent the right side of the electrical component 560 from being uncoupled from the electrical connector 510 (e.g., during shipping and/or handling of the system 500). This retention of the electrical component 560 may, for example, occur in the case that the moveable retention mechanism is positioned to latch onto the electrical component 560 and/or a portion thereof (e.g., at a first orientation). According to some embodiments, the moveable retention mechanism 530 may also, when rotated away from the electrical component 560 (e.g., in a direction opposite that of the directional arrow 572 and/or to a second orientation), eject the electrical component (and/or the right side thereof) from the electrical connector 510 (and/or the channel 516 thereof). In some embodiments, the fixed retention mechanism 540 may also or alternatively substantially prevent the left side of the electrical component 560 from being uncoupled from the electrical connector 510 (e.g., in the case that the electrical component 560 is substantially fully inserted into the channel 560).

In some embodiments, the moveable retention mechanism 530 may not be required to secure and/or otherwise couple the electrical component 560 to the electrical connector 510 (e.g., such as in the system 400 described herein). The electrical component 560 and/or the channel may 516, for example, be configured to provide an interference and/or other fit that secures the electrical component 560 in the channel 516.

Figure 6:
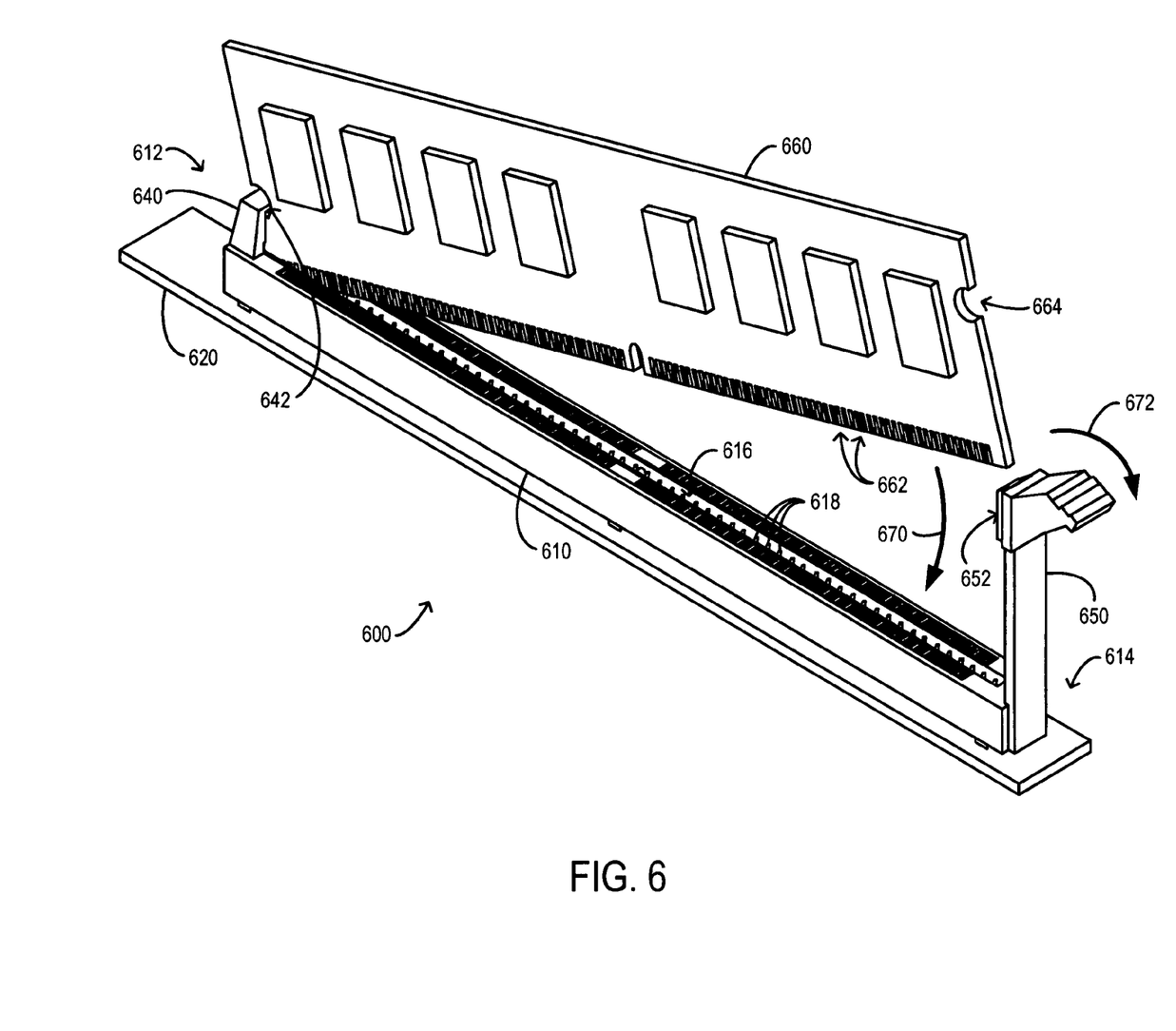
FIG. 6 is a perspective diagram of a system according to some embodiments.

Turning to FIG. 6, a perspective diagram of a system 600 according to some embodiments is shown. In some embodiments, the system 600 may be similar to the systems 200, 400, 500 as described in conjunction with any of FIG. 2, FIG. 4, and/or FIG. 5. According to some embodiments, the system 600 may be utilized to perform and/or may be otherwise associated with the method 300 described herein.

The system 600 may, for example, comprise an electrical connector 610. The electrical connector 610 may, according to some embodiments, comprise a first end 612 and a second end 614. The electrical connector 610 may also or alternatively define a channel 616. In some embodiments, one or more electrical contacts 618 may be disposed within the channel 616.

The electrical connector 610 may, according to some embodiments, be coupled to a substrate 620. According to some embodiments, the electrical connector 610 may also or alternatively comprise a fixed retention mechanism 640 disposed on and/or coupled to the first end 612 of the electrical connector 610. In some embodiments, the fixed retention mechanism 640 may comprise a lip 642. The electrical connector 610 may also or alternatively comprise a single pliant portion 650, such as an integrated moveable retention mechanism, disposed on and/or coupled to the second end 614. The integrated moveable retention mechanism 650 may, according to some embodiments, comprise a protrusion 652 to couple to an electrical component 660. The electrical component 660 may, for example, comprise a plurality of electrical contacts 662 and/or one or more detents 664.

According to some embodiments, the components 610, 612, 614, 616, 618, 620, 640, 642, 660, 662, 664 of the system 600 may be similar in configuration and/or functionality to the similarly-named components described in conjunction with any of FIG. 2, FIG. 4, and/or FIG. 5. In some embodiments, the system 600 may include fewer or more components than are shown in FIG. 6.

In some embodiments, the fixed retention mechanism 640 may function to permit and/or facilitate the rotation and/or coupling of the electrical component 660 (e.g., as described elsewhere herein). According to some embodiments, the integrated moveable retention mechanism 650 may be utilized to secure the electrical component 660 (and/or the right side thereof). The integrated moveable retention mechanism 650 may, for example, be utilized instead of a non-integrated moveable retention mechanism such as the moveable retention mechanisms 530 described herein. In some embodiments, the integrated moveable retention mechanism 650 may function similarly to the standard non-integrated moveable retention mechanism, while decreasing manufacturing and/or assembly costs and/or increasing system reliability.

For example, the electrical component 660 may be coupled to the fixed retention mechanism 640 (e.g., at 302) and/or rotated into the channel 616 (e.g., at 304) in accordance with the directional arrow 670. At some point during the rotation, the right edge and/or right side of the electrical component 660 may, according to some embodiments, engage and/or contact the integrated moveable retention mechanism 650. The electrical component 660 may, for example, contact the protrusion 652 (and/or an upper portion thereof). In some embodiments, the engagement of the electrical component 660 with the integrated moveable retention mechanism 650 (and/or the protrusion 652) may force the upper portion of the integrated moveable retention mechanism 650 away from the electrical component 660 (e.g., in accordance with the directional arrow 672).

The integrated moveable retention mechanism 650 may, for example, be capable of being biased away from the electrical component 660. In some embodiments, the rotation of the electrical component 660 may continue until the electrical component 660 is substantially fully inserted into the channel 616. According to some embodiments, the right side and/or edge of the electrical component 660 may continue to bias the integrated moveable retention mechanism 650 in accordance with the directional arrow 672 throughout rotation (e.g., after the initial contact).

In some embodiments, the electrical component 660 may comprise one or more detents 664 such as the semi-circular cutouts shown in FIG. 6. According to some embodiments, the detents 664 may be configured (e.g., positioned and/or sized) to facilitate and/or permit coupling of the electrical component 660 to the electrical connector 610. For example, the left detent 664 may be positioned on the lower portion of the left side of the electrical component 660 such that when the left side of the electrical component 660 is inserted into the channel 616 (e.g., at the first end 612), the detent 664 may engage the lip 642 of the fixed retention mechanism 640. In some embodiments, the fixed retention mechanism 640 may be configured to couple to the detent 664, which may for example, be configured in accordance with a specification (such as a standard specification for memory modules). In some embodiments, a lower position of the detent 664 may be utilized to increase the ease and/or efficiency of the rotation, and/or to decrease the amount of material required to construct the fixed retention mechanism 640.

According to some embodiments, the right detent 664 may also or alternatively be configured to permit and/or facilitate coupling of the electrical component 660 to the electrical connector 610. For example, the left detent 664 may be positioned on an upper portion of the right side of the electrical component 660, such that when the electrical component 660 (and/or the right side thereof) is substantially inserted into the channel 616, the detent 664 may align with the protrusion 652 of the integrated moveable retention mechanism 650. The alignment of the detent 664 with the protrusion 652 may, for example, remove the force applied by the electrical component 660 to bias the integrated moveable retention mechanism 650. The integrated moveable retention mechanism 650 (and/or the upper portion thereof) may then, for example, move substantially back to the original position (e.g., before contact with the electrical component 660) in accordance with the opposite direction of the arrow 672, to latch onto the detent 664. The latching may, according to some embodiments, lock the electrical component 660 (and/or the right side thereof) into the channel 616 and/or prevent substantial movement of the electrical component 660 (e.g., to maintain coupling during handling and/or shipping of the system 600).

In some embodiments, the use of the integrated moveable retention mechanism 650 may reduce manufacturing and/or assembly costs and/or otherwise contribute to the reliability of the system 600. The integrated moveable retention mechanism 650 may, for example, be integrated with the electrical connector 610, reducing the number of parts and/or assembly steps required to manufacture the system 600. In some embodiments, the integrated moveable retention mechanism 650 may be molded, milled, and/or otherwise manufactured from the same material and/or piece of material utilized to manufacture the electrical connector 610. The integral and/or biasing nature of the integrated moveable retention mechanism 650 may also, for example, eliminate the need to use a pin to provide latching and/or unlatching capabilities. The system 600 may, according to some embodiments, be more reliable and/or less likely to suffer structural failure than standard systems utilizing pins.

Although the fixed retention mechanism 640 and/or the lip 642 and/or the integrated moveable retention mechanism 650 and/or the protrusion 652 are described in conjunction with the configuration depicted in FIG. 6, other configurations may be utilized without deviating from the scope of some embodiments. The size and/or position of any of the elements shown 640, 642, 650, 652 may, for example, be altered while maintaining the functionalities described herein. In some embodiments for example, the protrusion 652 may be or include a detent, a notch, a latch, and/or any other object, feature, and/or device that is capable of coupling to the electrical component 660 and/or the detent 664.

According to some embodiments, the integrated moveable retention mechanism 650 may be biased directly by a user inserting the electrical component 660 into the electrical connector 610. The user may, for example, use a thumb to bias the integrated moveable retention mechanism 650 away from the electrical component 660 (e.g., in accordance with the directional arrow 672), and then let the integrated moveable retention mechanism 650 move back to latch onto the electrical component 660 once the electrical component is inserted into the channel 616. In some embodiments, the integrated moveable retention mechanism 650 may latch onto the upper right corner of the electrical component 660 and/or no detent 664 may be otherwise required to permit and/or facilitate latching.

Figure 7:
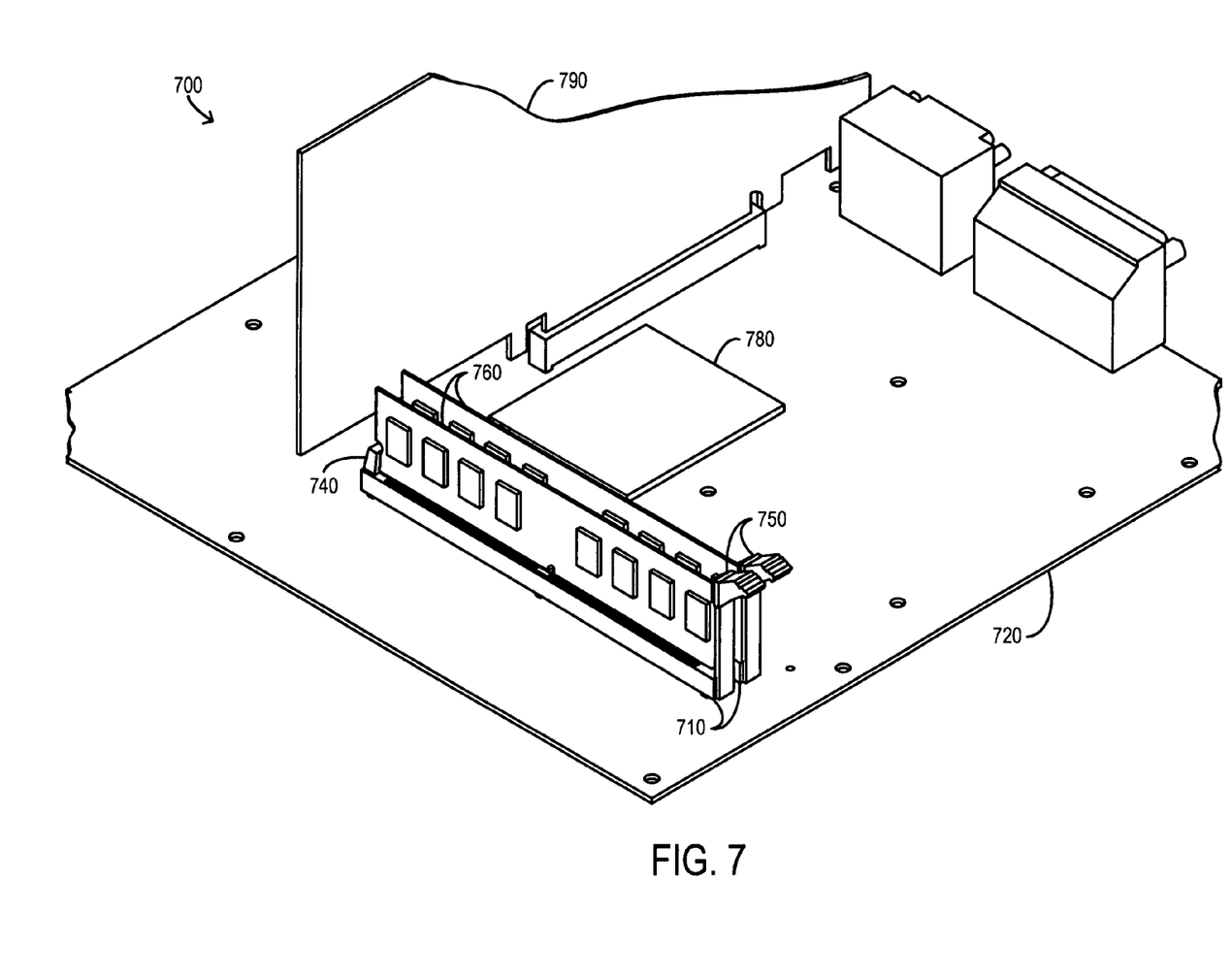
FIG. 7 is a perspective diagram of a system according to some embodiments.

Referring now to FIG. 7, a perspective diagram of a system 700 according to some embodiments is shown. In some embodiments, the system 700 may be similar to the systems 200, 400, 500, 600 as described in conjunction with any of FIG. 2, FIG. 4, FIG. 5, and/or FIG. 6. According to some embodiments, the system 700 may be utilized to perform and/or may be otherwise associated with the method 300 described herein. The system 700 may, for example, comprise one or more electrical connectors 710. The electrical connectors 710 may, for example, be disposed on a substrate 720. Each electrical connector 710 may also or alternatively, according to some embodiments, comprise a fixed retention mechanism 740 and/or a single pliant portion 750 (e.g., an integrated moveable retention mechanism) to couple to one or more electrical components 760. The system 700 may further comprise a processor 780 and/or an expansion card 790. According to some embodiments, the components 710, 720, 740, 750, 760 of the system 700 may be similar in configuration and/or functionality to the similarly-named components described in conjunction with any of FIG. 2, FIG. 4, FIG. 5, and/or FIG. 6. In some embodiments, the system 700 may include fewer or more components than are shown in FIG. 7.

The system 700 may, according to some embodiments, be or include a PC, server, and/or other computational or electrical device. In some embodiments, such as shown in FIG. 7 for example, the system 700 may be configured in compliance with an ATX form factor. The substrate 720 may, for example, be a PCB such as a motherboard for an ATX compliant PC. In some embodiments, the electrical components 760 may be or include memory modules. The memory modules 760 may comprise, for example, any type of memory for storing data, such as Single Data Rate Random Access Memory (SDR-RAM), Double Data Rate Random Access Memory (DDR-RAM), and/or Programmable Read Only Memory (PROM).

The processor 780 may be or include any number of processors, which may be or include any type or configuration of processor, microprocessor, and/or micro-engine that is or becomes known or available. The expansion card 790 may be any type of PCB, daughter board, and/or expansion card that is or becomes known. The expansion card 790 may, for example, be a graphics card such as a PCI Express™ x16 (DVI/VGA/TV-out) ATI Radeon™ X800 XT graphics card. The electrical connectors 710 may, according to some embodiments, couple the memory modules 760 to the motherboard 720 so that the memory modules 760 (and/or instruction stored thereon) may be utilized by either or both of the processor 780 and the expansion card 790.

In some embodiments, the use of the fixed retention mechanisms 740 may save space and/or reduce conflicts within the system 700. For example, in typical systems (e.g., utilizing standard moveable retention mechanisms) a conflict may exist between the expansion card 790 and the standard moveable retention mechanism (and/or a user's thumb or finger attempting to operate the retention mechanism) on the left side of the electrical connectors 710. Due to larger sized memory modules 760 and/or space constraints within the system 700 in general, the standard moveable retention mechanisms may not, for example, be suitable and/or desirable for use in the system 700. The fixed retention mechanism 740, however, does not require any space to be utilized (e.g., for memory module 760 insertion) between the electrical connectors 710 and the expansion card 790.

In some embodiments, the utilization of either or both of the fixed retention mechanisms 740 and the integrated moveable retention mechanisms 750 may reduce manufacturing and/or assembly costs of the system 700. In the case that the electrical connectors 710 comprise both the fixed retention mechanisms 740 and the integrated moveable retention mechanisms 750, for example, the electrical connectors 710 may be manufactured as single-piece components, requiring little or no assembly. Further, the integral nature of the retention mechanisms 740, 750 in the system 700 may (e.g., by reducing the number of parts and/or moving parts) increase the reliability and/or integrity of the electrical connectors 710 (e.g., with respect to typical connectors).

The several embodiments described herein are solely for the purpose of illustration. Other embodiments may be practiced with modifications and alterations limited only by the claims.

What is claimed is:

1. A system, comprising:
an electrical connector comprising a first end and a second end, wherein the electrical connector defines a channel;
one or more electrical contacts disposed within the channel;
a fixed retention mechanism coupled to the first end of the electrical connector, wherein the fixed retention mechanism is to couple to a detent portion of an electrical component, wherein the fixed retention mechanism is immoveable, and wherein the fixed retention mechanism is to act as a fulcrum for the detent portion of the electrical component to facilitate a rotational insertion of the electrical component into the channel; and
a moveable retention mechanism coupled to the second end of the electrical connector, the moveable retention mechanism to allow a release of the electrical component from the channel without dislodging the electrical component from the channel.

2. The system of claim 1, wherein the moveable retention mechanism comprises a single pliant element integral with the second end of the electrical connector.

3. The system of claim 1, wherein the moveable retention mechanism is moveable to a first orientation to couple to a portion of the electrical component to prevent substantial movement of the electrical component in the case that the electrical component is coupled to the electrical connector.

4. The system of claim 3, wherein the moveable retention mechanism is moveable to a second orientation to facilitate the uncoupling of the electrical component from the electrical connector.

5. The system of claim 1, wherein the electrical component comprises one or more electrical contacts to couple to the electrical contacts of the electrical connector.

6. The system of claim 1, wherein the detent portion of the electrical component comprises a semi-circular cutout in the electrical component.

7. The system of claim 1, wherein the detent portion of the electrical component is disposed on a first end of the electrical component.

8. The system of claim 7, wherein the fixed retention mechanism comprises a lip that is to engage the detent portion of the electrical component.

9. A method, comprising:
coupling a first portion of an electrical component to a fixed retention mechanism coupled to a first end of an electrical connector, wherein the first portion of the electrical component comprises a detent portion, and wherein the fixed retention mechanism is immoveable;
rotating the electrical component to couple a plurality of electrical contacts of the electrical component to a plurality of electrical contacts disposed within a channel defined by the electrical connector, the fixed retention mechanism to act as a fulcrum for the detent portion of the electrical component to facilitate a rotational insertion of the electrical component into the channel; and
coupling a second portion of the electrical component to a moveable retention mechanism coupled to a second end of the electrical connector, the moveable retention mechanism to allow a release of the electrical component from the channel without dislodging the electrical component from the channel.

10. The method of claim 9, wherein the first portion of the electrical component comprises a semi-circular cutout on a first end of the electrical component and the fixed retention mechanism comprises a lip that is to engage the semi-circular cutout.

11. The method of claim 9, wherein the moveable retention mechanism comprises a single pliant portion molded onto the second end of the electrical connector.

12. A system, comprising:
an electrical connector comprising a first end and a second end, wherein the electrical connector defines a channel;
one or more electrical contacts disposed within the channel;
a fixed retention mechanism coupled to the first end of the electrical connecter, wherein the fixed retention mechanism is to couple to a detent portion of an electrical component, wherein the fixed retention mechanism is immoveable, and wherein the fixed retention mechanism is to act as a fulcrum for the detent portion of the electrical component to facilitate a rotational insertion of the electrical component into the channel;
a processor in communication with the electrical connector;
a double data rate memory comprising electrical contacts coupled to the electrical contacts disposed within the channel, wherein the memory is to store instructions to be executed by the processor; and
a moveable retention mechanism coupled to the second end of the electrical connector, the moveable retention mechanism to allow a release of the electrical component from the channel without dislodging the electrical component from the channel.

13. The system of claim 12, wherein the system comprises a computer in compliance with an ATX form factor.

14. The system of claim 12, wherein the moveable retention mechanism comprises a single pliant element integral with the second end of the electrical connector.

* * * * *